United States Patent
Han et al.

(10) Patent No.: US 9,490,829 B2
(45) Date of Patent: Nov. 8, 2016

(54) METHOD FOR SYNTHESIZING FREQUENCY AND ELECTRONIC DEVICE THEREOF

(71) Applicant: Samsung Electronics Co., Ltd., Suwon-si, Gyeonggi-do (KR)

(72) Inventors: Sang-Wook Han, Suwon-si (KR); Sung-Jun Lee, Suwon-si (KR); In-Yup Kang, San Diego, CA (US); Thomas Byunghak Cho, Seongnam-si (KR); Joon-Hee Lee, Goyang-si (KR); Si-Bum Jun, Hwaseong-si (KR); Jong-Won Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/244,206

(22) Filed: Apr. 3, 2014

(65) Prior Publication Data

US 2014/0300390 A1    Oct. 9, 2014

(30) Foreign Application Priority Data

Apr. 3, 2013    (KR) ........................ 10-2013-0036462

(51) Int. Cl.
*H03L 7/10* (2006.01)
*H03L 7/197* (2006.01)

(52) U.S. Cl.
CPC ............ *H03L 7/104* (2013.01); *H03L 7/1976* (2013.01); *H03L 2207/05* (2013.01)

(58) Field of Classification Search
CPC ............................ H03L 7/18; H03L 2207/05
USPC ............ 331/17, 25, 44, 177 R; 327/107, 147
See application file for complete search history.

(56) References Cited

U.S. PATENT DOCUMENTS

| 4,272,729 | A | 6/1981 | Riley, Jr. | |
| 6,597,249 | B2* | 7/2003 | Chien et al. | ............. 331/177 R |
| 7,579,919 | B1 | 8/2009 | Cao | |
| 8,503,503 | B1* | 8/2013 | Tsang et al. | ................. 375/135 |

* cited by examiner

Primary Examiner — Jeffrey Shin
(74) Attorney, Agent, or Firm — Jefferson IP Law, LLP (57) ABSTRACT

An electronic device for synthesizing a frequency is provided. The electronic device includes a bank changer configured to output a channel code corresponding to a reference frequency signal and a feedback frequency signal, a channel code mapper configured to generate a changed channel code by applying an offset to the channel code output from the bank changer, and a voltage controlled oscillator configured to control a total capacitance of a plurality of capacitors based on the changed channel code and to oscillate a frequency dependent on the total capacitance.

20 Claims, 6 Drawing Sheets

METHOD FOR SYNTHESIZING FREQUENCY AND ELECTRONIC DEVICE THEREOF

CROSS-REFERENCE TO RELATED APPLICATION(S)

This application claims the benefit under 35 U.S.C. §119(a) of a Korean patent application filed on Apr. 3, 2013 in the Korean Intellectual Property Office and assigned Serial number 10-2013-0036462, the entire disclosure of which is hereby incorporated by reference.

TECHNICAL FIELD

The present disclosure relates to a method for synthesizing a frequency and an electronic device thereof.

BACKGROUND

A frequency synthesizer includes a Voltage Controlled Oscillator (VCO) for generating various frequencies through voltage control and a Phase Locked Loop (PLL) for locking a frequency generated in the voltage controlled oscillator with a feed-back loop to provide improved frequency stability.

The voltage controlled oscillator uses a LC oscillation method in which an oscillation frequency is determined mainly by the inductance of a coil and the capacitance of a capacitor. When the values of the inductor and the capacitor are fixed in the voltage controlled oscillator using the LC oscillation method, an oscillation frequency is changed by changing only input voltage, a very large VCO gain is required, and power consumption and phase noise increase. Therefore, there is suggested a method for changing a resonant frequency by controlling a capacitance of a voltage controlled oscillator based on a channel code. Such a voltage controlled oscillator includes a capacitor bank array having a plurality of capacitors and a plurality of switches and operates according to a binary weighted array method for changing a total capacitance by controlling the plurality of switches according to an input channel code.

In the voltage controlled oscillator using the binary weighted array, the total capacitance which is changed by the channel code needs to have linearity. That is, when the channel code of the voltage controlled oscillator increases uniformly, a capacitance sum corresponding to each channel code need to increase at uniform intervals. However, intervals between total capacitances may be non-uniform due to process variation and/or a fringe capacitance. As a result, this leads to a situation in which frequency steps of oscillation frequencies of the voltage controlled oscillator become non-uniform.

Figure 1:
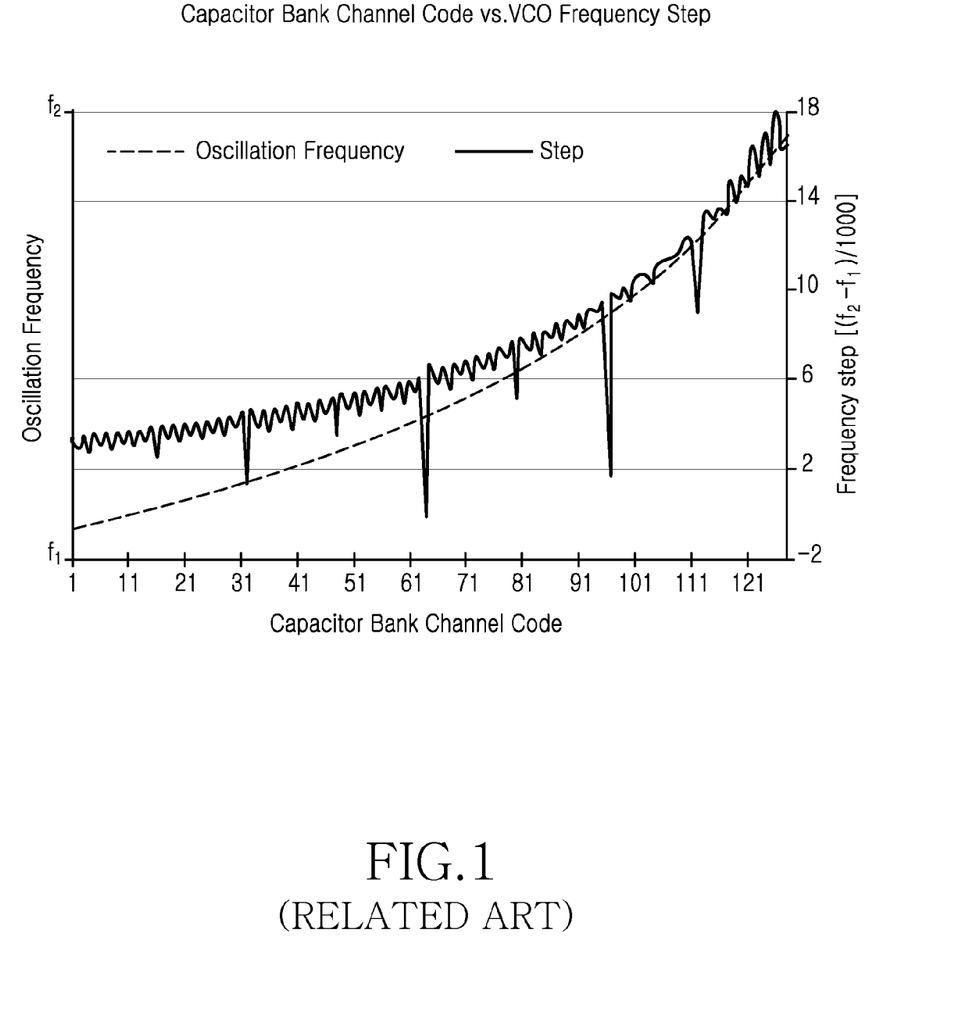
FIG. 1 is a diagram illustrating frequency steps in a voltage controlled oscillator according to the related art.
Figure 2:
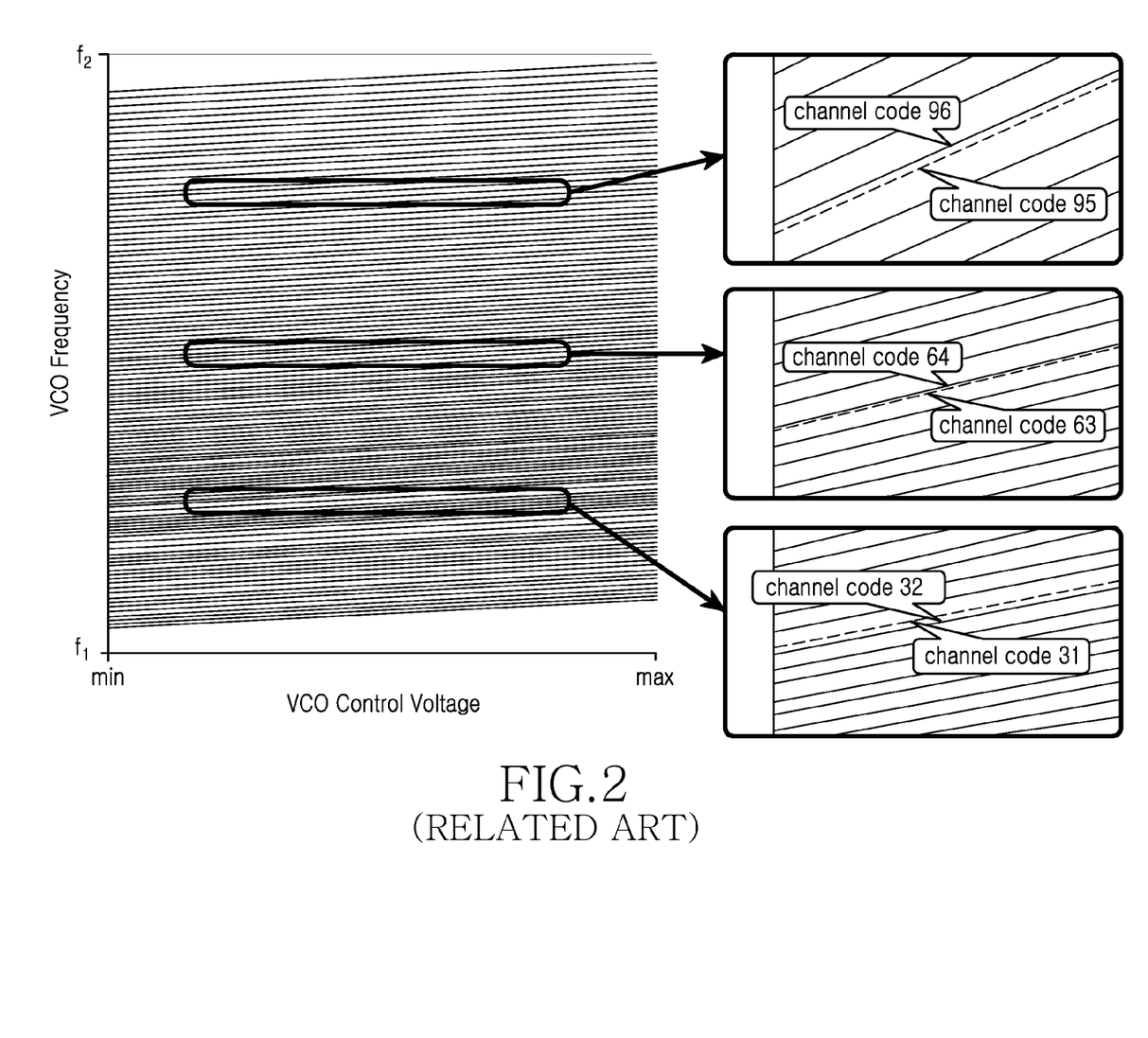
FIG. 2 is a diagram illustrating frequency steps non-uniformly according to channel codes in a voltage controlled oscillator according to the related art.

For example, when the value of a channel code input to the voltage controlled oscillator increases gradually, the value of the oscillation frequency of the voltage controlled oscillator needs to increase gradually. However, when the value of the channel code increases gradually as illustrated in FIG. 1, the frequency steps of frequencies corresponding to specific channel codes may become narrow or there may occur an inversion phenomenon in which the frequency decreases when the channel code increases. For example, when a channel code 31 is changed to a channel code 32, there occurs an inversion phenomenon in which a frequency oscillated according to the channel code 31 is lower than a frequency oscillated according to the channel code 32 as illustrated in FIG. 2. In addition, when a channel code 63 is changed to a channel code 64, a phenomenon may occur which frequencies oscillated according to the two channel codes are identical to each other. When a channel code 95 is changed to a channel code 96, there may occur a phenomenon in which the frequency step between a frequency corresponding to the channel code 95 and a frequency corresponding to the channel code 96 is narrower than a frequency step of frequencies corresponding to other channel codes.

When the frequency step size of frequencies oscillated by the voltage controlled oscillator decreases or there occurs the inversion phenomenon, there is a problem in which a frequency lock time increases which is taken to distinguish a desired frequency among two consecutive frequencies in a frequency synthesizer. In addition, in the binary weighted array, a binary search algorithm is used. When an error occurs during searching, there may occur a situation in which a desired frequency is not searched unlike a liner search method. For example, in a case where the inversion phenomenon occurs when the channel code 31 is changed to the channel code 32 as illustrated in FIG. 2, an incorrect capacitor bank code is accessed during the binary search and eventually a desired frequency may be not searched.

Accordingly, a technology for ensuring linearity of a voltage controlled oscillator in order to improve frequency search efficiency is desired.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are address at least the above-mentioned problems and/or disadvantages and to provide at least the advantages below. Accordingly, an aspect of the present disclosure is to provide a method and electronic device for controlling frequency steps of a voltage controlled oscillator in a frequency synthesizer.

Another aspect of the present disclosure is to provide a method and electronic device for selectively eliminating and rearranging channel codes to be input to a voltage controlled oscillator in order to ensure linearity of the voltage controlled oscillator in a frequency synthesizer.

Another aspect of the present disclosure is to provide a method and electronic device for rearranging channel codes by applying offsets to channel codes to be input to a voltage controlled oscillator in a frequency synthesizer.

In accordance with an aspect of the present disclosure, an electronic device for synthesizing a frequency is provided. The electronic device includes a bank changer configured to output a channel code corresponding to a reference frequency signal and a feedback frequency signal, a channel code mapper configured to generate a changed channel code by applying an offset to the channel code output from the bank changer, and a voltage controlled oscillator configured to control a total capacitance of a plurality of capacitors based on the changed channel code and to oscillate a frequency dependent on the total capacitance.

In accordance with another aspect of the present disclosure, a method for synthesizing a frequency is provided. The method includes: generating a channel code corresponding to a reference frequency signal and a feedback frequency signal, changing the channel code by applying an offset to the generated channel code, and oscillating a frequency by controlling a total capacitance of a voltage controlled oscillator based on the changed channel code.

In accordance with another aspect of the present disclosure, an electronic device for synthesizing a frequency in an electronic device is provided. The electronic device includes a frequency synthesizer configured to generate a channel code corresponding to a reference frequency signal and a feedback frequency signal, to change the channel code by applying an offset to the generated channel code, and to oscillate a frequency by controlling a total capacitance of a voltage controlled oscillator based on the changed channel code.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will become more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present disclosure provides a technology of controlling a frequency offset of a voltage controlled oscillator in a frequency synthesizer included in an electronic device.

Figure 3:
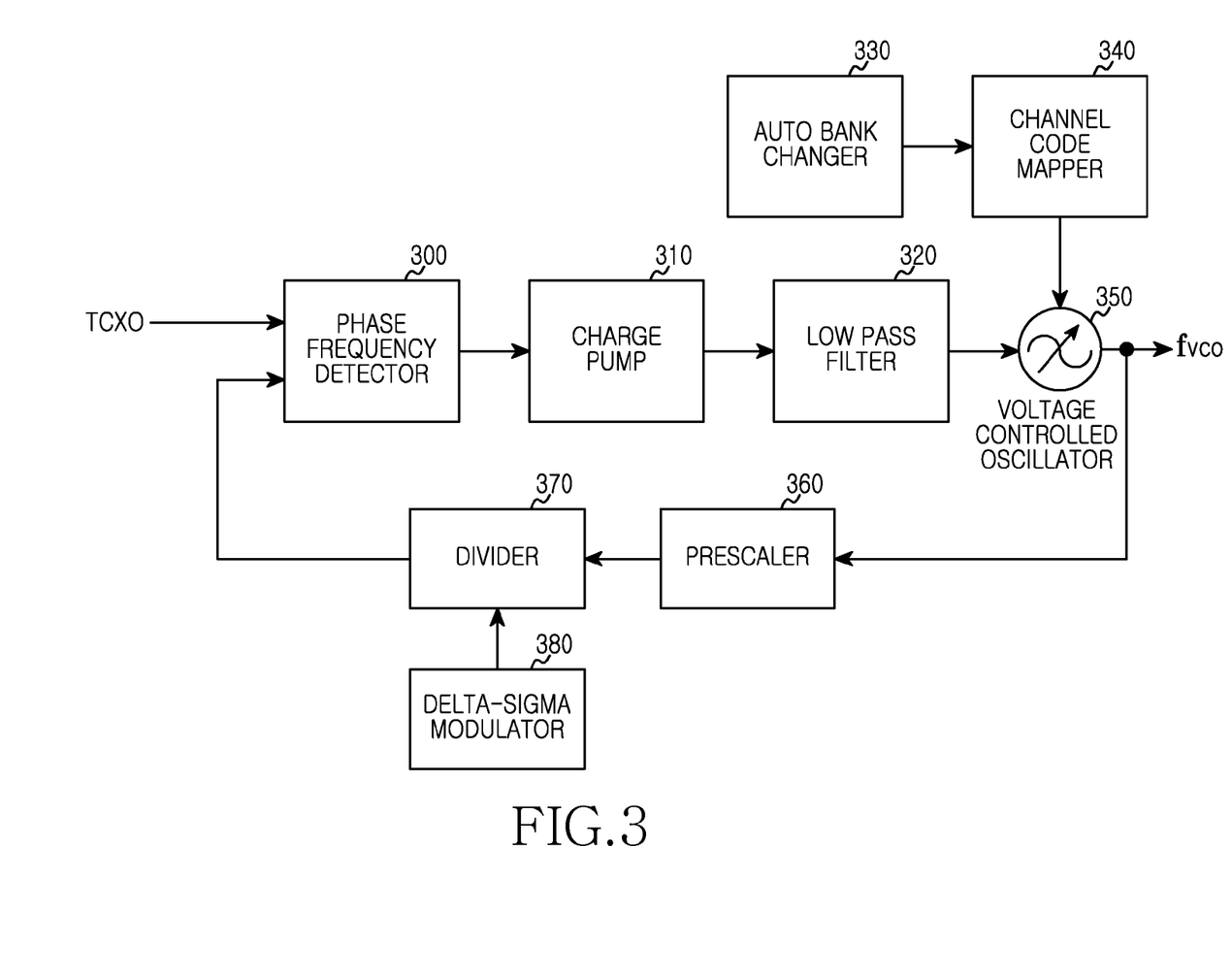
FIG. 3 is a diagram illustrating a block configuration of a frequency synthesizer according to an embodiment of the present disclosure.

FIG. 3 illustrates a block configuration of a frequency synthesizer according to an embodiment of the present disclosure.

Referring to FIG. 3, a frequency synthesizer may include a phase frequency detector 300, a charge ump 310, a low pass filter 320, an auto bank changer 330, a channel code mapper 340, a voltage controlled oscillator 350, a prescaler 360, a divider 370, a delta-sigma modulator 380.

The phase frequency detector 300 compares an input reference frequency signal with a feedback frequency signal output from the divider 370 to measure a phase difference between the reference frequency signal and the feedback signal and generates and outputs a clock signal indicating measured phase difference. The reference frequency signal may be a signal output from a Temperature Compensated X-tal Oscillator (TCXO).

The charge pump 310 receives the clock signal indicating the phase difference and pushes or pulls charge (or current) of an amount corresponding to the pulse width of the input clock signal. The low pass filter 320 is generally called a loop filter. The low pass filter 320 accumulates and then outputs a charge input by the charge pump 310, filters out a signal corresponding to a preset low frequency band, and provides a result of the filtering to the voltage controlled oscillator 350.

The auto bank changer 330 generates and outputs channel codes for controlling an oscillation frequency of the voltage controlled oscillator 350. For example, when a capacitor bank array included in the voltage controlled oscillator 350 includes M capacitors, the auto bank changer 330 may output M-bit channel codes indicating respective numbers corresponding to 0 to $M^2-1$. That is, the auto bank changer may output $M^2$ channel codes. The auto bank changer 330 compares the reference frequency with the feedback frequency and generate and output a channel code by changing the channel code according to a predetermined method until a channel code for generating an oscillation frequency closest to the reference frequency is selected.

The channel code mapper 340 examines channel codes output from the auto bank changer 330 and eliminates an error channel code which may be problematic. That is, the channel code mapper 340 eliminates channel codes which may cause error among channel codes output from the auto bank changer 330 and provides remaining channel codes to the voltage controlled oscillator 350. In this case, the channel code which may cause error refers to a channel code which makes frequency steps of oscillation frequencies oscillated in the voltage controlled oscillator 350 non-uniform, that is, a channel code of which the frequency step between another channel code is less than a threshold step or which cause the inversion phenomenon. In the following description, a channel code which may cause error is called "an error channel code" for convenience of description. In this case, an error channel code may be determined based on N high-order bits or N high-order bytes of a channel code. For example, the channel code mapper 340 may determine two consecutive codes, of which a first high-order bit or second high-order bit value is changed, among consecutive channel codes as error channel codes. In an example, when channel codes 0000000, 0000001, 0000010, . . . , 0111111, and 1111111 are input from the auto bank changer 330, the channel code mapper 340 may determine channel codes "0 011111(31)" and "0100000(32)" of which the second high-order bit is changed from 0 to 1 as error channel codes, determine channel codes "0111111(63)" and "1000000(64)" of which the first high-order bit is changed from 0 to 1 as error channel codes, and determine channel codes "1 011111(95)" and "1100000(96)" of which the second high-order bit is changed from 0 to 1 as error channel codes. In this case, the channel code mapper 340 may determine both two channel codes of which the N-th high-order bit value is changed from 0 to 1 as error channel codes, or determine only a channel code having a smaller value or a channel code having a larger value as an error channel code. In addition, the channel code mapper 340 may determine one channel code which makes frequency steps uniform among two channel codes of which the N-th high-order bit is changed as a normal channel code which cause no error, and determine one remaining channel code as an error channel code. In this case, the error channel code may be previously determined according to a predetermined method or be directly input from a manufacturer or a designer before the channel code mapper 340 receives a channel code from the auto bank changer 330.

The channel code mapper 340 rearranges input channel codes by applying offsets respectively to channel codes input from the auto bank changer 330 in order to eliminate an error channel code. In this case, the offsets refer to values to be applied respectively to channel codes in order to eliminate an error channel code and rearrange the channel codes to be input to the voltage controlled oscillator 350. The channel code mapper 340 divides all channel codes into a plurality of sections and applies different offsets to respective channel code sections, thereby eliminating an error channel code. For example, when the error channel codes are "31", "63", and "95", the channel code mapper 340 sets an offset for channel codes 1 to 31 to −1, sets an offset for channel codes 32 to 62 to 0, sets an offset for channel codes 63 to 93 to 1, and sets an offset for channel codes 94 to 127 to 2 such that input channel codes 0 to 127 are rearranged not to include "31", "63", and "95".

Figure 4:
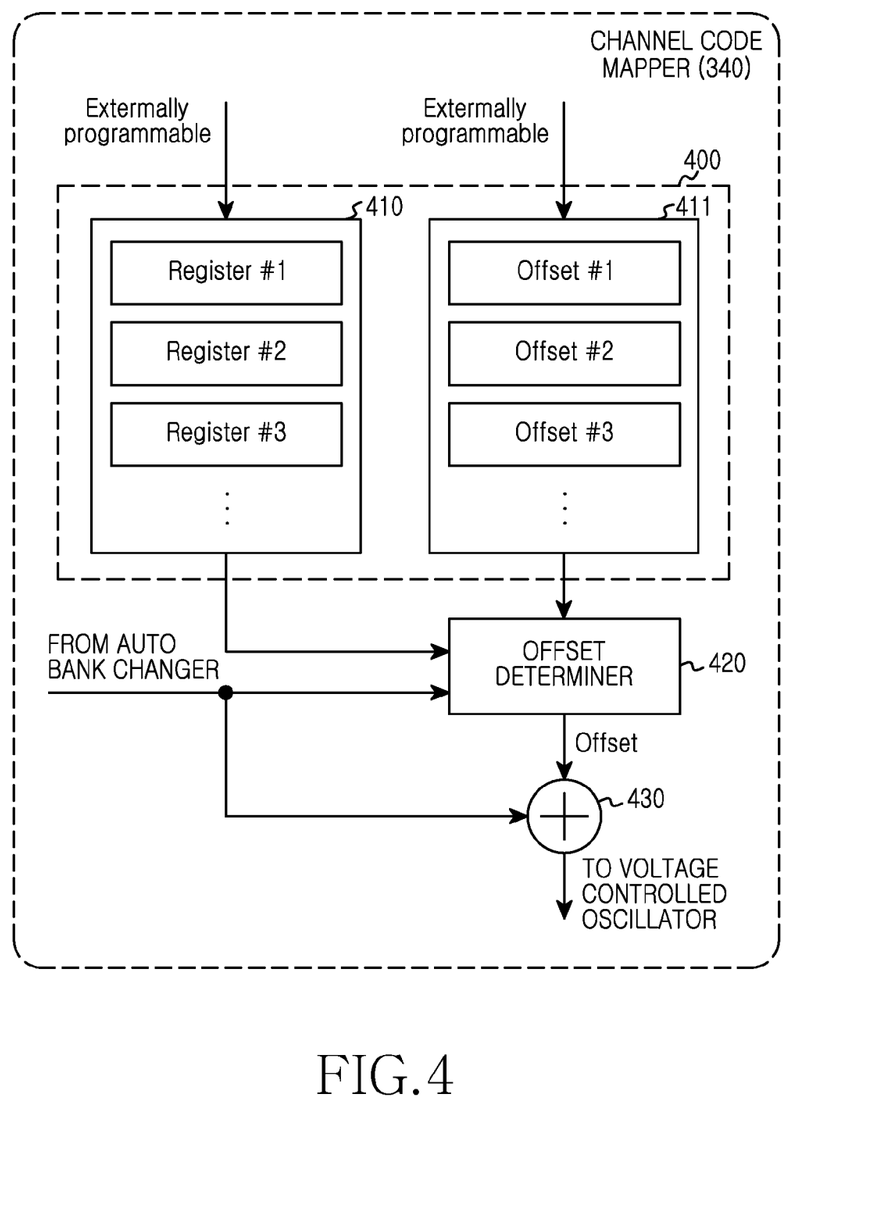
FIG. 4 is a diagram illustrating a detailed block configuration of the channel code mapper of FIG. 3 according to an embodiment of the present disclosure.

According to an embodiment of the present disclosure, the channel code mapper 340 may include a storage unit 400 including a plurality of registers 410 and a plurality of offsets 411, an offset determiner 420, and an adder 430 as illustrated in FIG. 4. In the channel code mapper 340, after the offset determiner 420 has determined offsets corresponding to input channel codes based on information about offsets for respective channel codes stored in the storage unit 400, the adder 340 adds the determined offset to the input channel code to output a channel code.

FIG. 4 is a diagram illustrating a detailed block configuration of the channel code mapper of FIG. 3 according to an embodiment of the present disclosure.

Referring to FIG. 4, a storage unit 400 includes a plurality of registers 410 indicating error channel codes and stores offsets 411 for respective channel codes determined based on an error channel code. For example, Register #1 may indicate that error channel codes are 31 and 32, Register #2 may indicate that error channel codes are 62 and 63, and Register #3 may indicate that error channel codes are 95 and 96. In another example, Register #1 may indicate that an error channel code is 31, Register #2 may indicate that an error channel code is 63, and Register #3 may indicate that an error channel code is 95. In still another example, the registers may indicate channel code sections divided based on error channel codes. That is, Register #1 may indicate 0 to 31, Register #2 may indicate 32 to 62, Register #3 may indicate 63 to 93, and Register #4 may indicate 95 to 127. In addition, the storage unit 400 stores a plurality of offsets 411. In this case, the plurality of offsets 411 may be mapped to the plurality of channel code sections divided based on error channel codes. For example, the offset for the channel codes 1 to 31 may be mapped to −1, the offset for the channel codes 32 to 62 may be mapped to 0, the offset for the channel codes 63 to 93 may be mapped to 1, and the offset for the channel codes 94 to 127 may be mapped to 2. In this case, the registers and the offsets may be set and changed by external access or automatically in consideration of input channel codes according to a predetermined method.

The offset determiner 420 determines offsets corresponding to channel codes input from the auto bank changer 330 based on the plurality of registers 410 and the plurality of offsets 411. For example, the offset determiner 420 may determine the registers corresponding to the input channel codes by comparing the input channel codes with the values of the respective registers and determine the offsets mapped to the determined registers as the offsets for the input channel codes. The offset determiner 420 outputs the offsets corresponding to the input channel codes to the adder 430. The adder 430 adds the offset output from the offset determiner 420 to the channel code input from the auto bank changer 330 and provides a result value to the voltage controlled oscillator 350.

Figure 5:
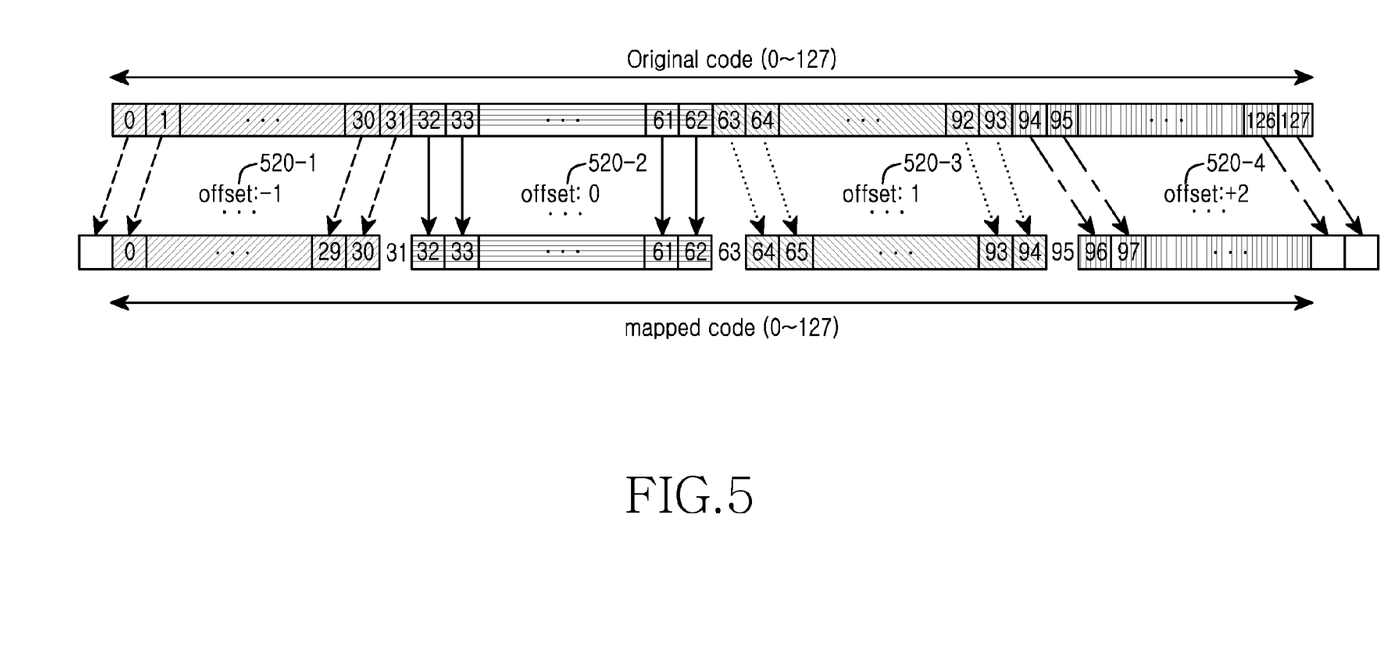
FIG. 5 is a diagram illustrating an example in which channel codes are rearranged in a frequency synthesizer according to an embodiment of the present disclosure.

FIG. 5 is a diagram illustrating an example in which channel codes are rearranged in a frequency synthesizer according to an embodiment of the present disclosure.

Referring to FIG. 5, when the error channel codes are set to "31", "63" and "95", the channel code mapper 340 adds the offset −1 (520-1) to the channel codes 1 to 31, adds the offset 0 (520-2) to the channel codes 32 to 62, adds the offset 1 (520-3) to the channel codes 63 to 93, and adds the offset 2 (520-4) to the channel codes 94 to 127 and then outputs the channel codes to provide the channel codes rearranged so as not to include the error channel codes 31, 63, and 95 to the voltage controlled oscillator 350.

The voltage controlled oscillator 350 includes the capacitor bank array and changes a total capacitance according to an input channel code, thereby changing an oscillation frequency. In this case, the capacitor bank array may include at least one inductor, a plurality of capacitors connected in parallel to each other, and a plurality of switches connected respectively to the plurality of capacitors. That is, the voltage controlled oscillator 350 changes the total capacitance by tuning on/off the plurality of switches connected to the plurality of capacitors according to an input channel code and generates a frequency dependent on the changed total capacitance. For example, when the capacitor bank array of the voltage controlled oscillator 350 includes M capacitors, the voltage controlled oscillator 350 may receive M-bit channel codes indicating respective numbers corresponding to 0 to $M^2-1$. In this case, the voltage controlled oscillator 350 maps the M bits constituting the M-bit channel code to the M switches respectively connected to the M capacitors to enable the M switches to be turned on/off according to respective values of the M bits. For example, since the first low-order bit to M-th high-order bit of an input M-bit channel code are mapped to a first switch to an M-th switch respectively, the voltage controlled oscillator 350 may change and generate a frequency in such a way that when the n-th bit of a channel code input to the voltage controlled oscillator 350 is 1, a corresponding n-th switch is turned on and the capacitance of a corresponding capacitor is changed. Also, the voltage controlled oscillator 350 may be configured differently according to design manners.

The prescaler 360 and the divider 370 divide the output frequency of the voltage controlled oscillator 350 according to a predetermined ratio and output the same. For example, when the output frequency of the voltage controlled oscillator 350 is 800 MHz, the prescaler 360 divides 800 MHz by ¹⁄₁₀₀ and outputs 8 MHz. In this case, the ratio at which the divider 370 divides the output frequency may be changed by a signal input from the delta-sigma modulator 380.

The delta-sigma modulator 380 outputs a signal for controlling a ratio at which the divider 370 divides an output frequency.

Figure 6:
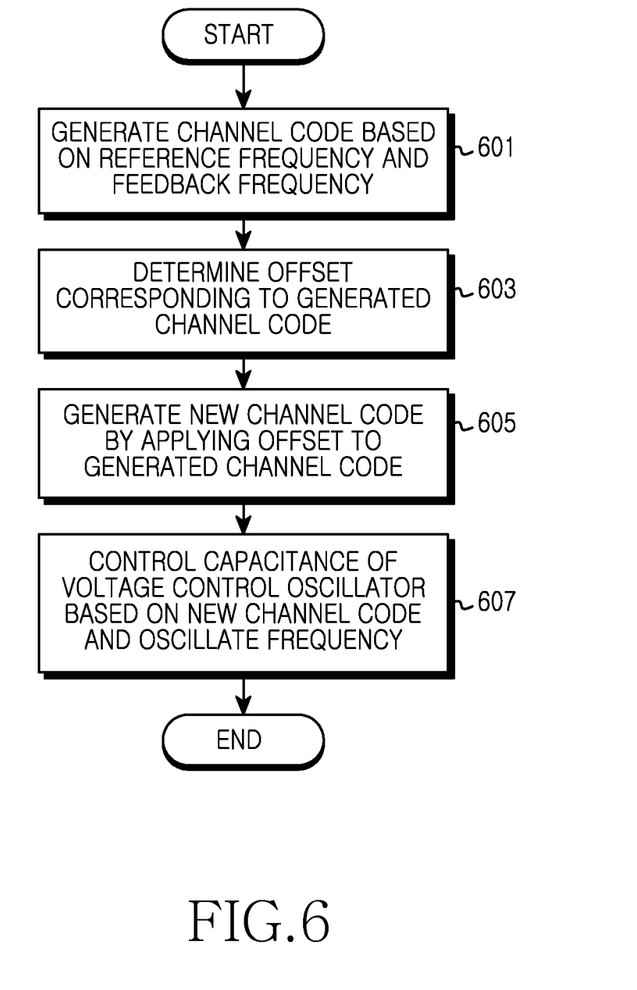
FIG. 6 is a diagram illustrating an operation process of a frequency synthesizer according to an embodiment of the present disclosure.

FIG. 6 illustrates an operation process of a frequency synthesizer according to an embodiment of the present disclosure.

Referring to FIG. 6, in operation 601, the frequency synthesizer generates a channel code based on a reference frequency and a feedback frequency. In this case, the reference frequency may be a signal output from a TCXO. In addition, the feedback frequency may be a frequency signal output from a voltage controlled oscillator included in the frequency synthesizer.

In operation 603, the frequency synthesizer determines an offset corresponding to the generated channel code. In this case, the frequency synthesizer may determine an error channel code based on N high-order bit values of the channel code and determine an offset value of each channel code based on the error channel code. For example, when it is assumed that a channel code of 7 bits is input, the frequency synthesizer may determine consecutive channel codes "0 0̲11111(31)" and "01̲00000(32)" of which the second high-order bit is changed from 0 to 1 as error channel codes, determine consecutive channel codes "0̲111111(63)" and "1̲000000(64) of which the first high-order bit is changed from 0 to 1 as error channel codes, and determine channel codes "10̲11111(95)" and "11̲00000(96)" of which the second high-order bit is changed from 0 to 1 as error channel codes. The frequency synthesizer may set an offset for channel codes 1 to 31 to −1, set an offset for channel codes 32 to 62 to 0, set an offset for channel codes 63 to 93 to 1, and set an offset for channel codes 94 to 127 to 2 based on the error channel code in advance. Therefore, the frequency synthesizer may set the offset to −1 when the generated channel code is 5, and set the offset to 0 when the generated channel code is 32.

In operation 605, the frequency synthesizer generates a new channel code by applying the offset to the generated channel code. That is, the frequency synthesizer generates a new channel code by applying the offset to the channel code generated through operation 601, thereby eliminating the error channel code.

In operation 607, the frequency synthesizer which has generated the new channel code controls the capacitance of a voltage controlled oscillator based on the new channel code to oscillate a frequency dependent on the adjusted capacitance. In this case, the frequency synthesizer may change a total capacitance of the voltage controlled oscillator and therefore, oscillate a frequency corresponding to the total capacitance by controlling turning on/off of a plurality of switches connected to a plurality of capacitors included in a capacitor bank array for the voltage controlled oscillator according to the channel code.

The frequency synthesizer may repeatedly perform operation 601 to operation 607 until a desired oscillation frequency is generated.

As described above, the frequency synthesizer eliminates an error channel code from channel codes to be input to the voltage controlled oscillator 350 according to the embodiment of the present disclosure, so that the voltage controlled oscillator 350 may generate frequencies at uniform steps. That is, errors in the capacitor bank array are corrected through rearrangement of the channel codes, thereby enabling the frequency synthesizer to normally operate according to the embodiment of the present disclosure. As a result, frequencies in all bands may be stably supported and a lock time is dramatically reduced at the time of changing a channel code, thereby reducing calibration time. When the error channel code is eliminated according to the embodiment of the present disclosure, an error of 1 Least Significant Bit (LSB) may occur due to characteristics of a binary search algorithm. Since the frequency synthesizer is generally designed to be tolerant to the error of 1 LSB, the error is no problem in terms of an entire system. Accordingly, the embodiment of the present disclosure optimizes a channel code without degrading the performance of the frequency synthesizer, thereby rapidly providing stable performance through a self-calibration in a radio frequency integrated circuit without performing a separate operation in a modem.

According to the various embodiments of the present disclosure, the frequency synthesizer which includes a frequency synthesizer having a capacitor bank array employing a binary weighted array selectively eliminates a channel code by applying offsets to channel codes input to the voltage controlled oscillator and therefore, rearranges the channel codes, thereby preventing a phenomenon in which frequency steps of oscillation frequencies of the voltage controlled oscillator are non-uniform. Accordingly, the lock time of the frequency synthesizer may be reduced, and switching between communication methods or between channels may be facilitated, thereby reducing power consumption.

While the disclosure has been shown and described with reference to certain various embodiments thereof, it will be understood by those skilled in the art that various changes in form and details may be made therein without departing from the spirit and scope of the disclosure as defined by the appended claims. A program command for performing operation implemented by various computers according to the various embodiments of the present disclosure may be recorded in a computer-readable recording medium. The computer-readable recording medium may include program commands, data files, and data structures in singularity or in combination. The program commands may be those that are especially designed and configured for the present disclosure, or may be those that are publicly known and available to those skilled in the art. Examples of the computer-readable recording medium include magnetic recording media such as hard disks, floppy disks and magnetic tapes, optical recording media such as CD-ROMs and DVDs, magneto-optical recording mediums such as floptical disks, and hardware devices such as ROMs, RAMs and flash memories that are especially configured to store and execute program commands. Examples of the program commands include machine language codes created by a compiler, and high-level language codes that can be executed by a computer by using an interpreter. When all or some of a base station or a relay described in the present disclosure is implemented by a computer program, a computer-readable recording medium storing the computer program is also included in the present disclosure. Therefore, the scope of the disclosure is defined not by the detailed description of the disclosure but by the appended claims, and all differences within the scope will be construed as being included in the present disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device for synthesizing a frequency, the electronic device comprising:
a changing unit configured to output a channel code corresponding to a reference frequency signal and a feedback frequency signal;
a mapping unit configured to generate a changed channel code by applying an offset to the channel code output from the changing unit; and
a voltage controlled oscillator configured to:
control a total capacitance of a plurality of capacitors based on the changed channel code, and
oscillate a frequency dependent on the total capacitance,
wherein the offset is determined to exclude an error channel code from channel codes output from the changing unit, and
wherein the error channel code causes an interval error between oscillation frequencies.

2. The electronic device of claim 1, wherein the mapping unit is further configured to:
determine the error channel code based on N high-order bits of the channel code, and
determine an offset for respective channel codes based on the determined error channel code.

3. The electronic device of claim 2, wherein the mapping unit is further configured to excludes the error channel code from channel codes to be provided to the voltage controlled oscillator by applying the offsets for respective channel codes to channel codes output from the changing unit.

4. The electronic device of claim 2, wherein the mapping unit is further configured to:
determine two consecutive channel codes of which at least one bit value of N high-order bits is changed among consecutive channel codes, and
determine at least one of the two determined channel codes as the error channel code.

5. The electronic device of claim 4, wherein the mapping unit is further configured to determine one channel code of the two channel codes as the error channel code based on frequency steps of oscillation frequencies for channel codes.

6. The electronic device of claim 2, wherein the mapping unit comprises:
an offset determiner configured to:
compare the output channel code with the error channel code, and
determine an offset for the output channel code; and
an adder configured to add the determined offset to the output channel code.

7. The electronic device of claim 1,
wherein the voltage controlled oscillator comprises:
a capacitor bank array including a plurality of capacitors connected in parallel to each other, and
a plurality of switches respectively connected to the plurality of capacitors, and
wherein the voltage controlled oscillator is configured to turn on/off the plurality of switches according to the changed channel code.

8. The electronic device of claim 1, further comprising:
a phase frequency detector configured to output a clock pulse signal corresponding to a phase difference between the reference frequency signal and the feedback frequency signal;
a charge pump configured to output charge of an amount according to a clock pulse of the signal output from the phase frequency detector;
a low pass filter configured to:
accumulate and output an input charge, and
filter out a signal corresponding to a predetermined low frequency band before provision to the voltage controlled oscillator; and
a divider configured to:
divide the oscillation frequency of the voltage controlled oscillator by a predetermined ratio, and
perform feedback to the phase frequency detector.

9. A method for synthesizing a frequency, the method comprising:
generating a channel code corresponding to a reference frequency signal and a feedback frequency signal;
changing the channel code by applying an offset to the generated channel code; and
oscillating a frequency by controlling a total capacitance of a voltage controlled oscillator based on the changed channel code,
wherein the offset is determined to exclude an error channel code from channel codes output from the changing unit, and
wherein the error channel code causes an interval error between oscillation frequencies.

10. The method of claim 9, wherein the changing of the channel code comprises:
determining the error channel code based on N high-order bits of the channel code; and
determining offsets for respective channel codes based on the determined error channel code.

11. The method of claim 10, further comprising:
excluding the error channel code from channel codes to be provided to the voltage control oscillator by applying the offsets for respective channel codes to the channel codes.

12. The method of claim 10, wherein the determining of the error channel code comprises:
determining two consecutive channel codes of which at least one bit value of N high-order bits is changed among consecutive channel codes, and
determining at least one of the two determined channel code as the error channel code.

13. The method of claim 12, wherein the determining of the at least one of the two determined channel codes as the error channel code comprises determining one channel code of the two channel codes as the error channel code based on frequency steps of oscillation frequencies for channel codes.

14. The method of claim 10, wherein the changing of the channel code comprises:
determining an offset for the output channel code by comparing the generated channel code with the error channel code; and
adding the determined offset to the generated channel code.

15. The method of claim 9,
wherein the voltage controlled oscillator comprises:
a capacitor bank array including a plurality of capacitors connected in parallel to each other, and
a plurality of switches respectively connected to the plurality of capacitors, and wherein the voltage controlled oscillator is configured to turn on/off the plurality of switches according to the changed channel code.

16. The method of claim 9, further comprising:

outputting a clock pulse signal corresponding to a phase difference between the reference frequency signal and the feedback frequency signal;

outputting charge of an amount according to a clock pulse of the output signal;

accumulating and outputting an input charge and filtering out a signal corresponding to a predetermined low frequency band before provision to the voltage controlled oscillator; and dividing an oscillation frequency of the voltage controlled oscillator according to a predetermined ratio and performing feedback.

17. An electronic device for synthesizing a frequency, the electronic device comprising:

a frequency synthesizer configured to:
  generate a channel code corresponding to a reference frequency signal and a feedback frequency signal,
  change the channel code by applying an offset to the generated channel code, and
  oscillate a frequency by controlling a total capacitance of a voltage controlled oscillator based on the changed channel code,
  wherein the offset is determined to exclude an error channel code form channel codes output from the changing unit, and
  wherein the error channel code causes an interval error between oscillation frequencies.

18. The electronic device of claim 17, wherein the frequency synthesizer is further configured to:
  determine the error channel code based on N high-order bits of a channel code, and
  determine offsets for respective channel codes based on the determined error channel code.

19. The electronic device of claim 18, wherein the frequency synthesizer is further configured to exclude the error channel code from channel codes to be provided to the voltage controlled oscillator by applying the offsets for respective channel codes to channel codes output from a changing unit.

20. The electronic device of claim 18, wherein the frequency synthesizer is further configured to:
  determine two consecutive channel codes of which at least one bit value of N high-order bits is changed among consecutive channel codes, and
  determine at least one of the two determined channel code as the error channel code.

* * * * *